US012757687B2

(12) United States Patent
Kim et al.

(10) Patent No.: US 12,757,687 B2
(45) Date of Patent: Oct. 6, 2026

(54) METHOD FOR FABRICATING A SEMICONDUCTOR DEVICE USING A WAFER INSPECTION APPARATUS

(71) Applicant: Samsung Electronics Co., Ltd., Suwon-si (KR)

(72) Inventors: Jhong Kwon Kim, Suwon-si (KR); Yong Ju Jeon, Suwon-si (KR); Ki Hun Kim, Suwon-si (KR); Da Young Myoung, Suwon-si (KR); Jeong-Su Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 341 days.

(21) Appl. No.: 18/382,998

(22) Filed: Oct. 23, 2023

(65) Prior Publication Data

US 2024/0304501 A1 Sep. 12, 2024

(30) Foreign Application Priority Data

Mar. 6, 2023 (KR) ........................ 10-2023-0029227

(51) Int. Cl.
*H10P 74/20* (2026.01)
*G01N 21/95* (2006.01)

(52) U.S. Cl.
CPC ....... *H10P 74/203* (2026.01); *G01N 21/9501* (2013.01)

(58) Field of Classification Search
CPC ........... G01N 21/8851; G01N 21/9501; G01N 21/956; H10P 74/203; H10P 74/23
See application file for complete search history.

(56) References Cited

U.S. PATENT DOCUMENTS 7,601,555 B2 10/2009 Kim et al.
7,659,973 B2 2/2010 Furman et al.
8,170,838 B2 5/2012 Rabello et al.
8,939,074 B2 1/2015 Prince
9,214,492 B2 12/2015 Tempel et al.
10,801,953 B2 10/2020 Wang et al.
(Continued)

FOREIGN PATENT DOCUMENTS

KR 10-2007-0074987 A 7/2007
KR 10-2022-0006180 A 1/2022

*Primary Examiner* — Hina F Ayub
(74) *Attorney, Agent, or Firm* — Muir Patent Law, PLLC

(57) ABSTRACT

A method for fabricating a semiconductor device is provided. The method for fabricating the semiconductor device includes a first step of loading a first wafer including a plurality of semiconductor chips having the same pattern on a stage of a wafer inspection apparatus, a second step of inspecting the plurality of semiconductor chips using light having different wavelengths from each other, and a third step of unloading the first wafer from the stage of the wafer inspection apparatus, wherein inspecting of the plurality of semiconductor chips using the light includes inspecting patterns at the same first positions of the respective semiconductor chips, inspecting patterns at the same second positions of the respective semiconductor chips, inspecting patterns at the same k-th positions of the respective semiconductor chips, and determining the semiconductor chip having a pattern defect by combining pattern inspection results at each of the first to k-th positions.

20 Claims, 17 Drawing Sheets

(56) References Cited

U.S. PATENT DOCUMENTS

| | | | | |
|---|---|---|---|---|
| 2006/0262295 | A1 | 11/2006 | Backhauss et al. | |
| 2011/0114951 | A1* | 5/2011 | Kamikubo | G01B 11/06<br>257/E23.179 |
| 2013/0108147 | A1* | 5/2013 | Harada | G06T 7/0004<br>382/149 |
| 2019/0206047 | A1* | 7/2019 | Honda | G01N 21/8851 |

* cited by examiner

METHOD FOR FABRICATING A SEMICONDUCTOR DEVICE USING A WAFER INSPECTION APPARATUS

CROSS-REFERENCE TO RELATED APPLICATION

This application claims priority to Korean Patent Application No. 10-2023-0029227 filed on Mar. 6, 2023 in the Korean Intellectual Property Office and all the benefits accruing therefrom under 35 U.S.C. 119, the contents of which in their entirety are herein incorporated by reference.

BACKGROUND

1. Technical Field

The present disclosure relates to a method for fabricating a semiconductor device using a wafer inspection apparatus.

2. Description of the Related Art

As processes are miniaturized, various structural abnormalities occur in various regions. As conventional inspection techniques for detecting the structural abnormalities, there are a point measurement using OCD (Optical Critical Dimension) measurement equipment, and a large-area upper defect inspection using BF (Bright Field) checker. In the case of the point measurement using the OCD (Optical Critical Dimension) measurement equipment, an accurate inspection is possible through analysis of the 3D structure, but it is difficult to inspect a front side of a wafer due to sampling limitations. Also, in the case of the large-area upper defect inspection using the BF (Bright Field) checker, although the front side measurement is possible through speed-up, there is a drawback that a lower structure cannot be detected.

SUMMARY

Aspects of the present disclosure provide a wafer inspection apparatus which obtains statistical information using light having different wavelengths from each other, thereby improving reliability of inspection of a wafer including a plurality of semiconductor chips including a pattern having a non-repetitive structure.

Aspects of the present disclosure also provide a wafer inspection method which obtains statistical information using light having different wavelengths from each other, thereby improving the reliability of inspection of a wafer including a plurality of semiconductor chips including a pattern having a non-repetitive structure.

Aspects of the present disclosure also provide a method for fabricating a semiconductor device using the wafer inspection apparatus which obtains statistical information using light having different wavelengths from each other, thereby improving the reliability of inspection of a wafer including a plurality of semiconductor chips including a pattern having a non-repetitive structure.

According to some embodiments of the present disclosure, there is provided a method for fabricating a semiconductor device, comprising a first step of loading a first wafer including a plurality of semiconductor chips having the same pattern on a stage of a wafer inspection apparatus, a second step of inspecting the plurality of semiconductor chips using light having different wavelengths from each other, and a third step of unloading the first wafer from the stage of the wafer inspection apparatus, wherein inspecting of the plurality of semiconductor chips using the light includes inspecting patterns at the same first positions of the respective semiconductor chips, inspecting patterns at same second positions of the respective semiconductor chips, inspecting patterns at same k-th positions of the respective semiconductor chips, and determining the semiconductor chip having a pattern defect by combining pattern inspection results at the first to k-th positions, k being a natural number of 3 or more, and wherein inspecting of the patterns at the first positions includes obtaining a first plurality of pieces of spectral information at the first positions using the light, obtaining a first spectral distribution information using the first plurality of pieces of spectral information, calculating a statistical distribution region from the first spectral distribution information, obtaining a spectral information not included in the statistical distribution region among the first plurality of pieces of spectral information, and determining the semiconductor chip having the spectral information not included in the statistical distribution region as a defect.

According to some embodiments of the present disclosure, there is provided a method for fabricating a semiconductor device, comprising loading a wafer including a plurality of semiconductor chips having the same pattern on a stage of a wafer inspection apparatus, providing a first light having a plurality of wavelengths to a spectrometer, splitting the first light into a second light having any one wavelength among the plurality of wavelengths using the spectrometer, providing the second light to the wafer, and inspecting the plurality of semiconductor chips using the second light, wherein inspecting of the plurality of semiconductor chips using the second light includes inspecting patterns at the same first positions of the respective semiconductor chips, inspecting patterns at the same second positions of the respective semiconductor chips, inspecting patterns at the same k-th positions of the respective semiconductor chips, and determining the semiconductor chip having a pattern defect by combining pattern inspection results at the first to k-th positions, k being a natural number of 3 or more, and wherein inspecting of the patterns at the first positions includes obtaining a first plurality of pieces of spectral information at the first positions using the second light, obtaining a first spectral distribution information using the first plurality of pieces of spectral information, calculating a statistical distribution region from the first spectral distribution information, obtaining a spectral information not included in the statistical distribution region among the first plurality of pieces of spectral information, and determining the semiconductor chip having the spectral information not included in the statistical distribution region as a defect.

According to some embodiments of the present disclosure, there is provided a method for fabricating a semiconductor device, comprising loading a wafer including a plurality of semiconductor chips having the same pattern on a stage of a wafer inspection apparatus, inspecting patterns at the same first positions of respective semiconductor chips using light having different wavelengths from each other, inspecting patterns at the same second positions of the respective semiconductor chips using the light, inspecting patterns at the same k-th positions of the respective semiconductor chips using the light, and determining the semiconductor chip having a pattern defect by combining pattern inspection results at the respective first to k-th positions, k being a natural number of 3 or more, wherein inspecting of the pattern at the first positions includes obtaining a first plurality of pieces of spectral information at the first positions using the light, obtaining a first spectral distribution information using the first plurality of pieces of spectral information, calculating a statistical distribution region from the first spectral distribution information, obtaining a spectral information not included in the statistical distribution region among the first plurality of pieces of spectral information, and determining the semiconductor chip having the spectral information not included in the statistical distribution region as a defect, wherein obtaining of the first plurality of pieces of spectral information at the first positions using the light comprises obtaining a first spectral information at the first position of a first semiconductor chip, obtaining a m-th spectral information at the first position of a j-th semiconductor chip, and obtaining the first plurality of pieces of spectral information by combining the first to m-th spectral information, each of j and m is a natural number of 3 or more, and wherein obtaining of the first spectral distribution information using the first plurality of pieces of spectral information comprises calculating a first distribution center which is a distribution center of the pieces of spectral information included in the first plurality of pieces of spectral information, and obtaining the first spectral distribution information using an extent to which each of the first plurality of pieces of spectral information is separated from the first distribution center.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

A wafer inspection apparatus according to some embodiments of the present disclosure will be described below with reference to FIGS. 1 to 3.

Figure 1:
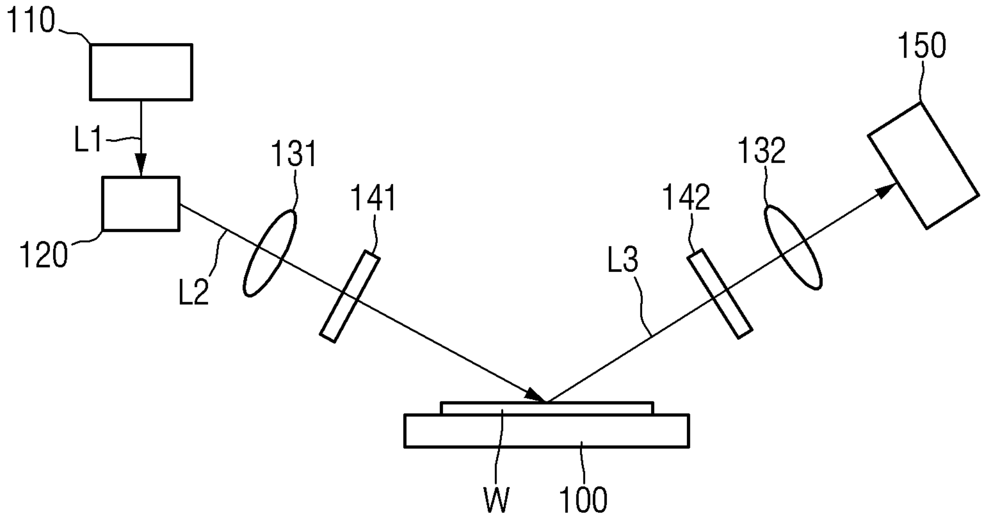
FIG. 1 is a schematic diagram for explaining a wafer inspection apparatus according to some embodiments of the present disclosure.

FIG. 1 is a schematic diagram for explaining a wafer inspection apparatus according to some embodiments of the disclosure. FIG. 2 is a plan view for explaining a layout of the wafer. FIG. 3 is a plan view for explaining semiconductor chips included in the wafer.

Figure 2:
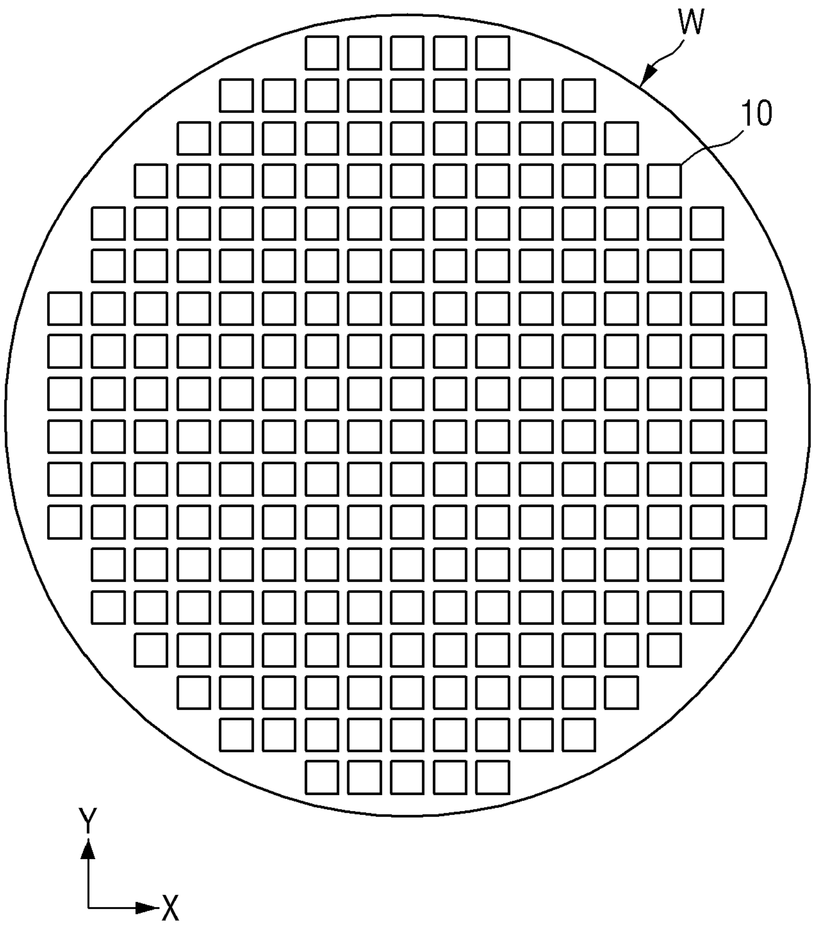
FIG. 2 is a plan view for explaining a layout of a wafer.
Figure 3:
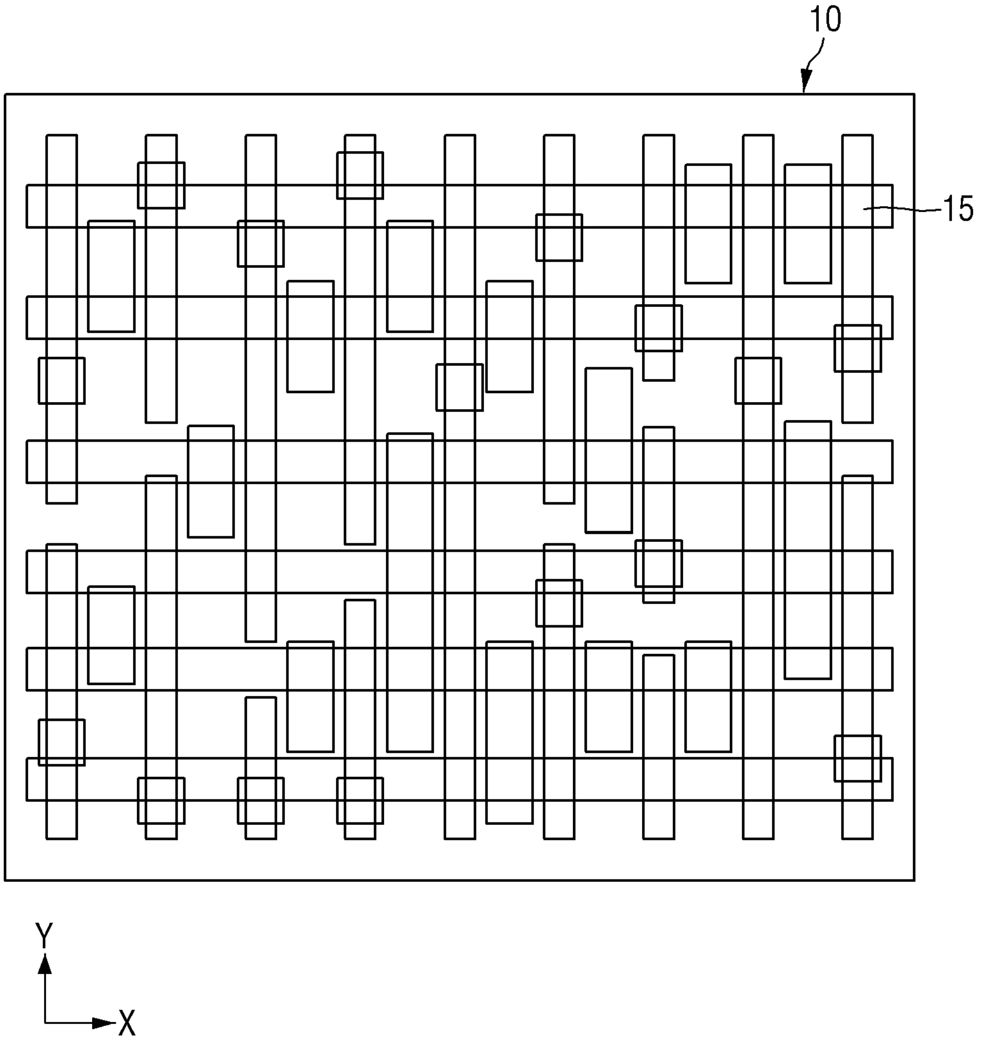
FIG. 3 is a plan view for explaining a semiconductor chip included in the wafer.

Referring to FIGS. 1 to 3, the wafer inspection apparatus according to some embodiments of the present disclosure includes a stage 100, a light source 110, a spectroscope 120, a first lens 131, a second lens 132, a first polarizer 141, a second polarizer 142, and a measuring unit 150.

The stage 100 may be disposed inside the wafer inspection apparatus. The wafer W may be loaded onto the stage 100. Hereinafter, each of a first direction X and a second direction Y may be defined as a direction parallel to an upper surface of the stage 100. Also, the second direction Y may be defined as a direction perpendicular to the first direction X.

The wafer W may include a plurality of semiconductor chips 10. For example, the wafer W may include a plurality of semiconductor chip regions each of which will be singularized to be a chip by a cutting/scribing step in a later procedure. The chip regions of the wafer W may be respectively indicated as chips 10 in the present disclosure. For example, each of the plurality of semiconductor chips 10 may include the same patterns 15 as each other. For example, the semiconductor chips 10 may be identical semiconductor devices to each other. For example, the patterns 15 included in each of the plurality of semiconductor chips 10 may be disposed in a non-repetitive manner, e.g., within the respective semiconductor chips 10. For example, as shown in FIG. 3, the patterns 15 disposed on one semiconductor chip 10 may be disposed in a non-repetitive manner. However, the present disclosure is not limited thereto. In some other embodiments, the patterns disposed on the semiconductor chip 10 may be disposed repeatedly.

The light source 110 may emit a first light L1 having a plurality of wavelengths. The first light L1 emitted from the light source 110 may be provided to the spectroscope 120. The spectroscope 120 may split the first light L1 having the plurality of wavelengths provided from the light source 110 into a second light L2 having any one wavelength. For example, the spectroscope 120 may sequentially split the first light L1 into the second light L2 having different wavelengths from each other.

The second light L2 split to have any one wavelength by the spectroscope 120 passes through the first lens 131 and the first polarizer 141 in sequence, and may be provided to the wafer W. The second light L2 provided from the spectroscope 120 may be reflected by the wafer W to generate a reflected light L3. The reflected light L3 passes through the second polarizer 142 and the second lens 132 in sequence, and may be provided to the measuring unit 150. The respective placements of the first lens 131, the second lens 132, the first polarizer 141, and the second polarizer 142 shown in FIG. 1 are exemplary. For example, in some other embodiments, the placements of each of the first lens 131, the second lens 132, the first polarizer 141, and the second polarizer 142 may vary.

Although FIG. 1 shows that the second light L2 is incident obliquely to the upper surface of the wafer W and the reflected light L3 is reflected obliquely to the upper surface of the wafer W, this is an example, and the present disclosure is not limited thereto. In some other embodiments, the second light L2 may be perpendicularly incident on the upper surface of the wafer W, and the reflected light L3 may be perpendicularly reflected from the upper surface of the wafer W.

The measuring unit 150 may inspect patterns of a plurality of semiconductor chips included in the wafer W by receiving the reflected light L3. For example, the measuring unit 150 may be a light detector configured to detect the reflected light L3. A detailed description of the method for inspecting the patterns of the plurality of semiconductor chips included in the wafer W by the measuring unit 150 will be described later.

A method for fabricating a semiconductor device using the wafer inspection apparatus according to some embodiments of the present disclosure will be described below with reference to FIGS. 1 to 4.

Figure 4:
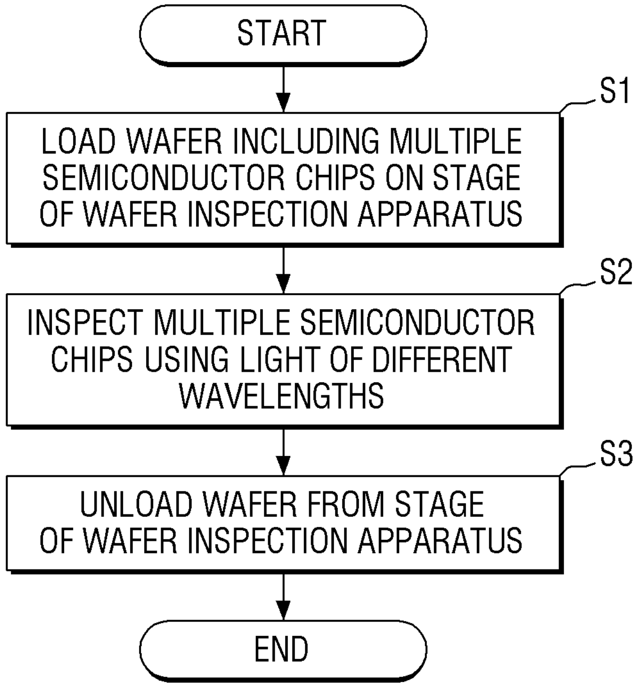
FIG. 4 is a flow chart for explaining a method for fabricating the semiconductor device using the wafer inspection apparatus according to some embodiments of the present disclosure.
Figure 5:
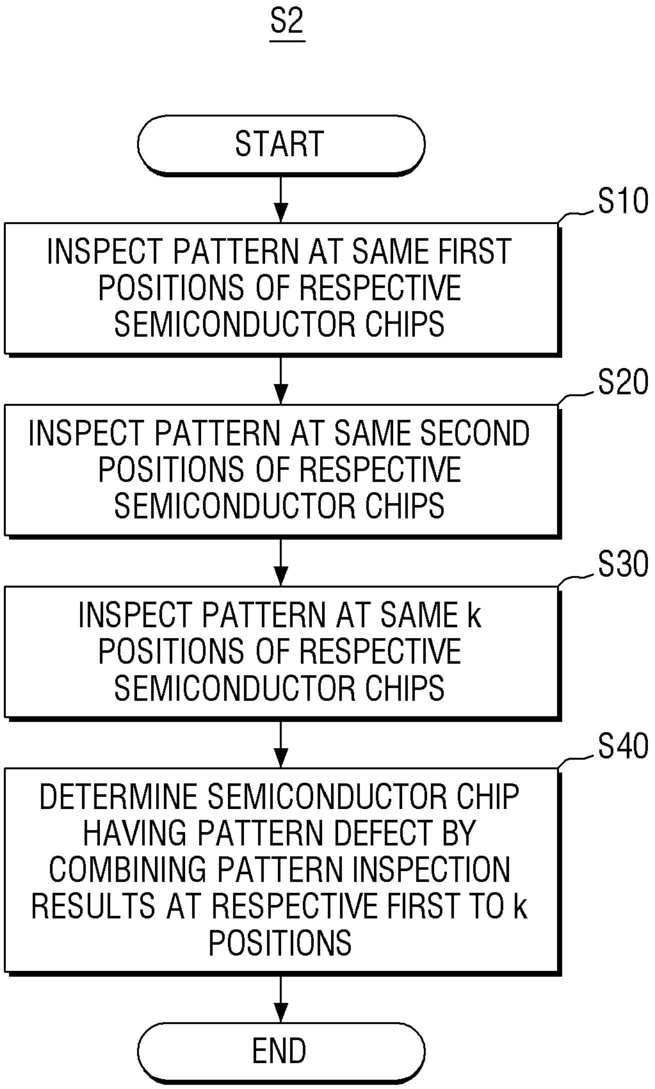
FIGS. 5 to 8 are flow charts for explaining a wafer inspection method according to some embodiments of the present disclosure.
Figure 6:
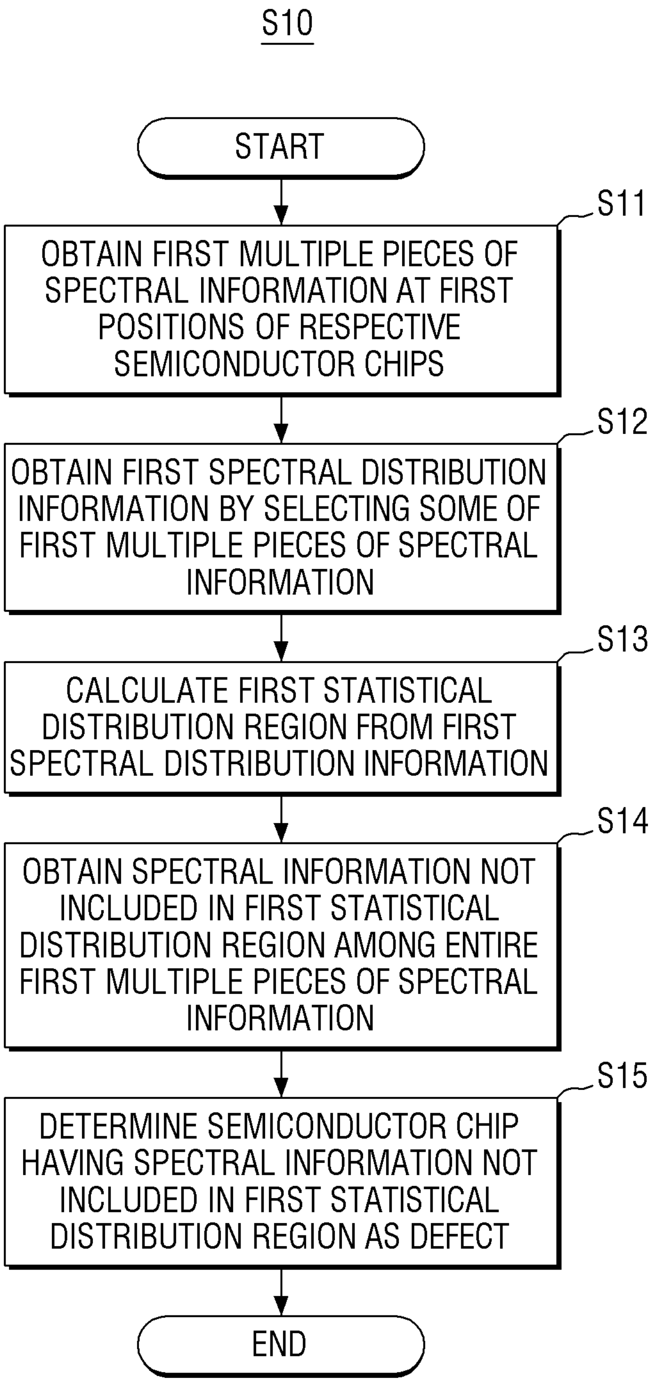
Figure 7:
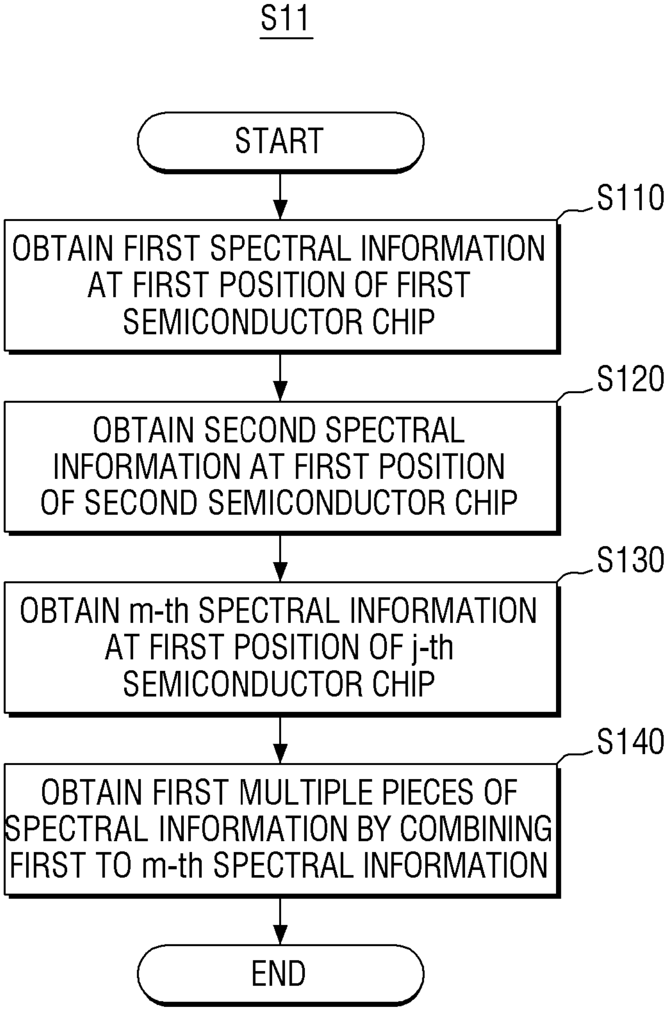
Figure 8:
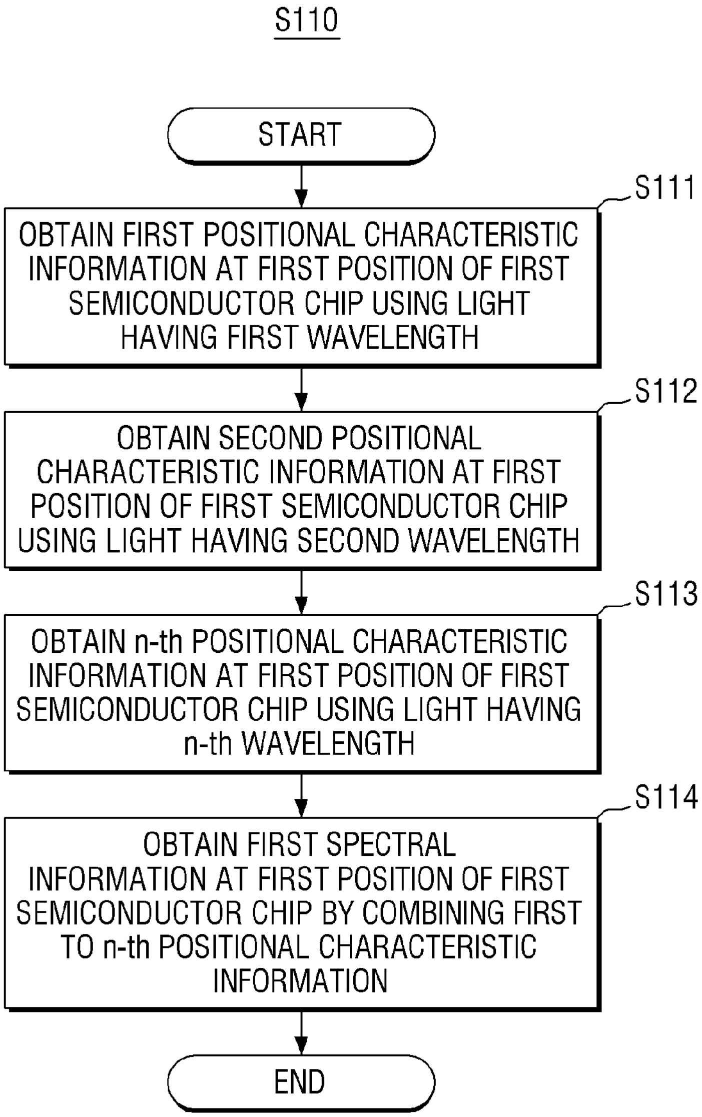

FIG. 4 is a flow chart for explaining a method for fabricating the semiconductor device using a wafer inspection apparatus according to some embodiments of the present disclosure.

Referring to FIGS. 1 to 4, the method for fabricating the semiconductor device using the wafer inspection apparatus according to some embodiments of the present disclosure may include a first step S1, a second step S2 and a third step S3. In the first step S1, a wafer W including a plurality of semiconductor chips 10 may be loaded onto the stage 100 of the wafer inspection apparatus. For example, each of the plurality of semiconductor chips 10 may include the same pattern 15 as each other. For example, the patterns 15 disposed on one semiconductor chip 10 may be disposed in a non-repetitive manner.

In the second step S2, the wafer W may be inspected using the wafer inspection apparatus. For example, a plurality of semiconductor chips 10 included in the wafer W may be inspected using second light L2 having different wavelengths from each other. A detailed description of the method for inspecting the wafer W will be provided later.

In the third step S3, the wafer W that has been inspected may be unloaded from the stage 100 of the wafer inspection apparatus. For example, one wafer W may be inspected by performing the first to third steps S1, S2, and S3. For example, different wafers W may be inspected, by repeatedly performing the first to third steps S1, S2, and S3.

The wafer inspection method using the wafer inspection apparatus according to some embodiments of the present disclosure will be described below with reference to FIGS. 1 to 13.

Figure 9:
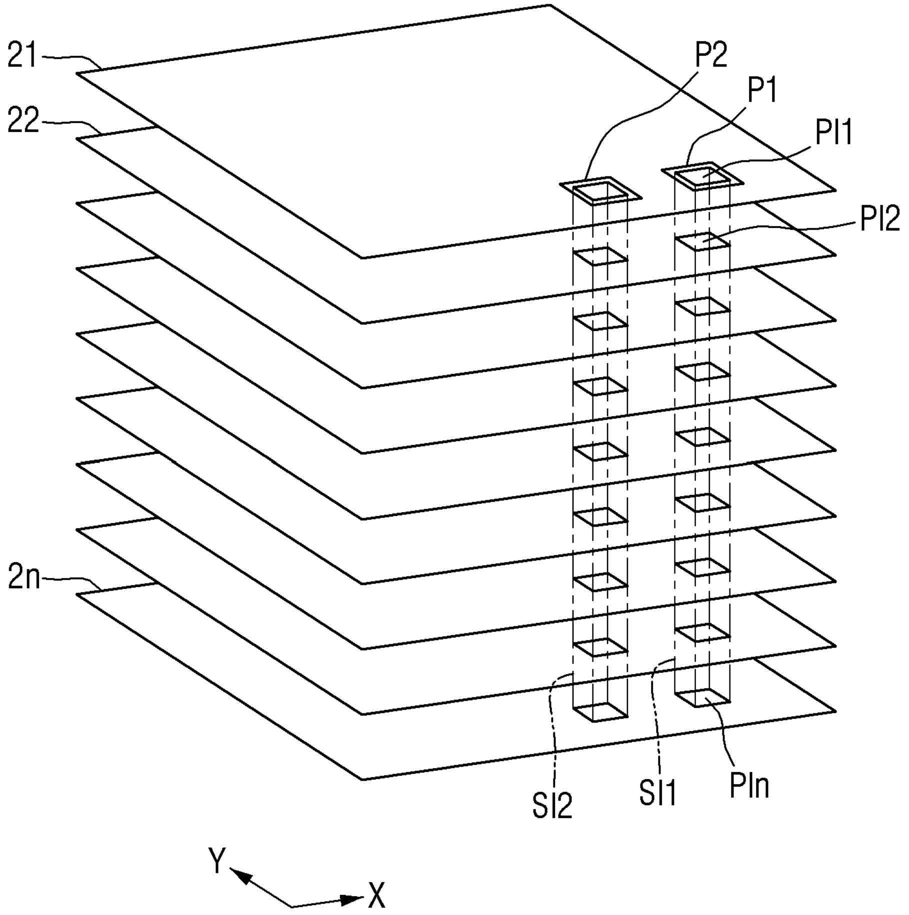
FIG. 9 is a diagram for explaining positional characteristic information and spectral information used in the wafer inspection method according to some embodiments of the present disclosure.
Figure 10:
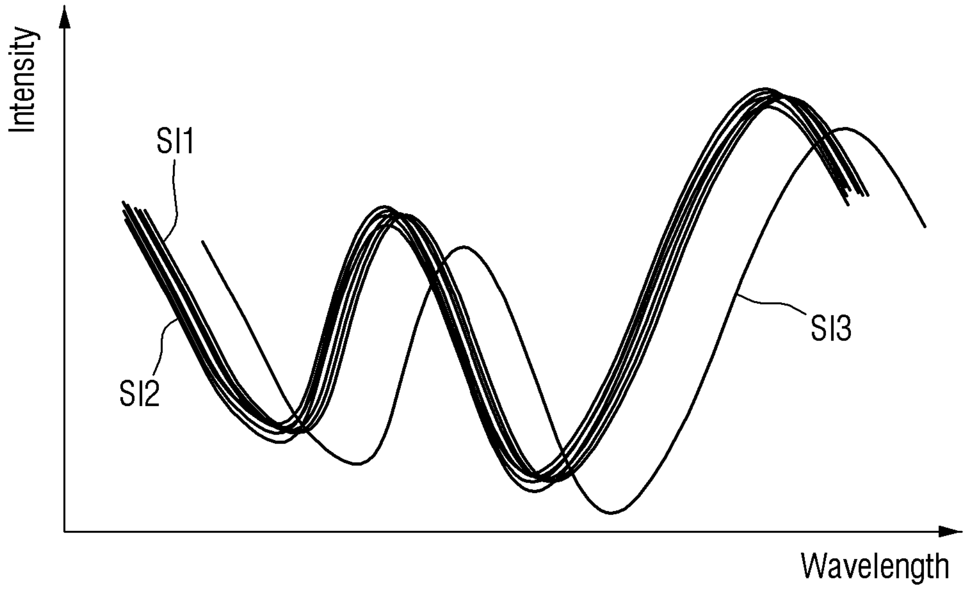
FIG. 10 is a graph for explaining spectral information used in the wafer inspection method according to some embodiments of the present disclosure.
Figure 11:
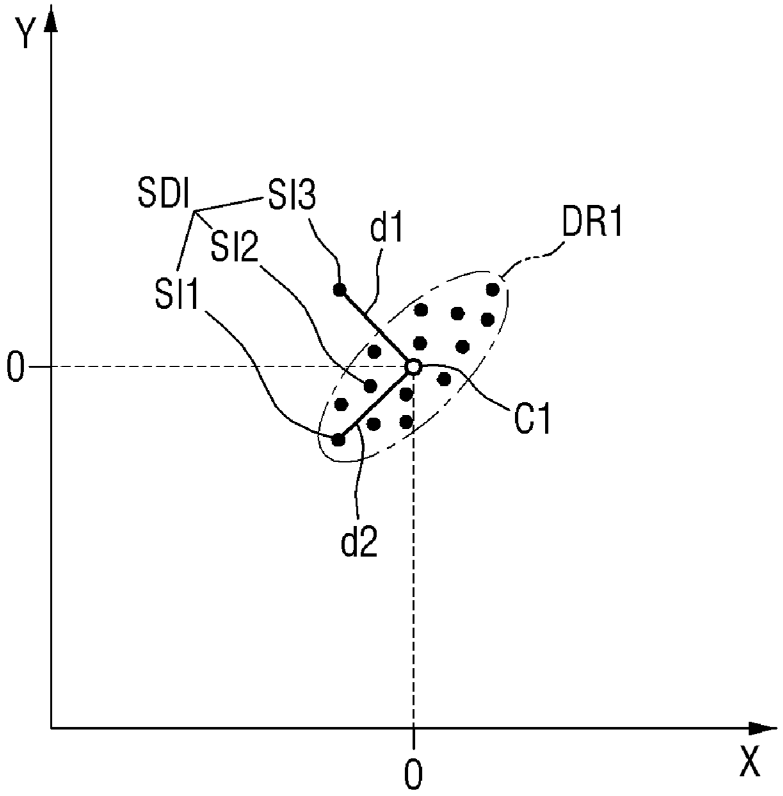
FIG. 11 is a graph for explaining spectral distribution information and a spectral distribution region used in the wafer inspection method according to some embodiments of the present disclosure.
Figure 12:
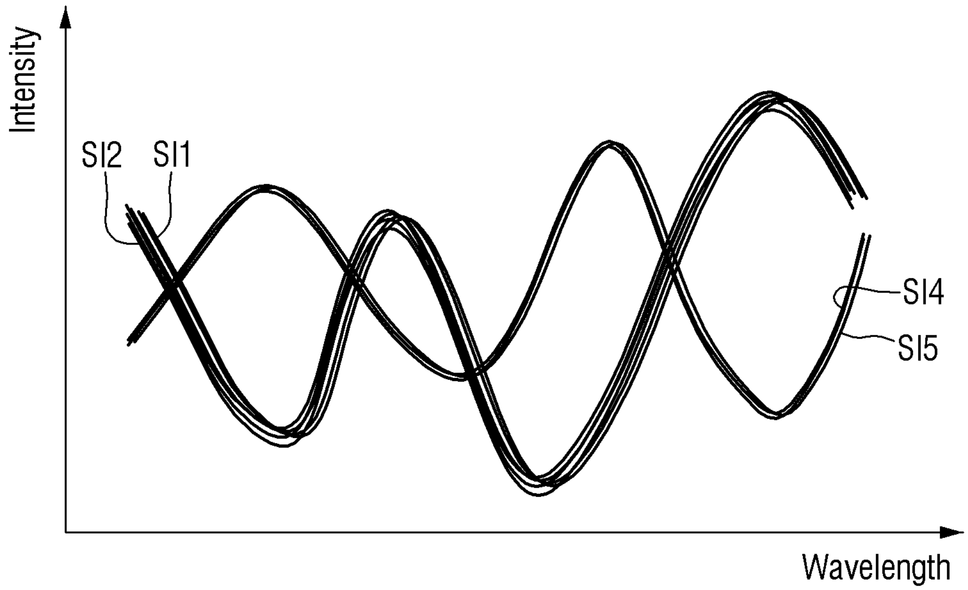
FIG. 12 is a graph for explaining spectral information used in the wafer inspection method according to some embodiments of the present disclosure.
Figure 13:
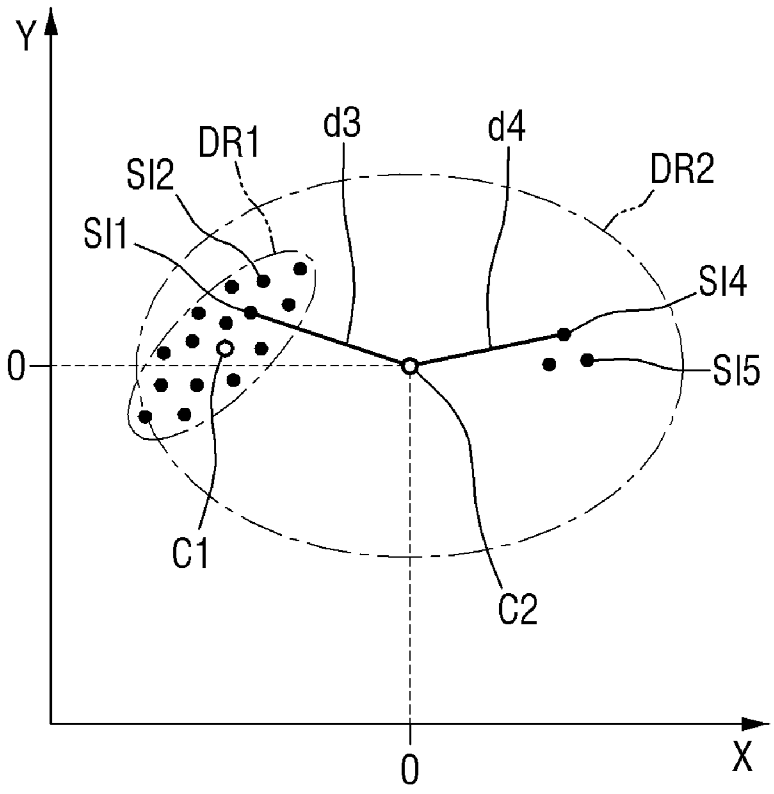
FIG. 13 is a graph for explaining spectral distribution information and a spectral distribution region used in the wafer inspection method according to some embodiments of the present disclosure.

FIGS. 5 to 8 are flow charts for explaining the wafer inspection method according to some embodiments of the present disclosure. FIG. 9 is a diagram for explaining positional characteristic information and spectral information used in the wafer inspection method according to some embodiments of the present disclosure. FIG. 10 is a graph for explaining spectral information used in the wafer inspection method according to some embodiments of the present disclosure. FIG. 11 is a graph for explaining spectral distribution information and a spectral distribution region used in the wafer inspection method according to some embodiments of the present disclosure. FIG. 12 is a graph for explaining spectral information used in the wafer inspection method according to some embodiments of the present disclosure. FIG. 13 is a graph for explaining spectral distribution information and a spectral distribution region used in the wafer inspection method according to some embodiments of the present disclosure.

Referring to FIGS. 1, 3, and 8 to 13, the measuring unit 150 may obtain first positional characteristic information PI1 at a first position P1 of the first semiconductor chip, using the second light L2 having the first wavelength (S111). For example, the measuring unit 150 may obtain the first wavelength characteristic information 21 of the first semiconductor chip, using the second light L2 having the first wavelength. For example, the measuring unit 150 may detect the third light L3 which is a reflected light of the second light L2 from the wafer W (e.g., from the first semiconductor chip), and obtain the first wavelength characteristic information 21 of the first semiconductor chip from the third light L3. The first wavelength characteristic information 21 may include characteristic information such as physical properties of the constituent, the shape of the pattern, and the thickness of the constituent of the semiconductor chip measured using the second light L2 having the first wavelength. The obtained first wavelength characteristic information 21 may include first positional characteristic information PI1 at the first position P1. For example, the first positional characteristic information PI1 may include characteristic information such as the physical properties of the constituent, the shape of the pattern, and the thickness of the constituent at the first position P1 of the first semiconductor chip measured using the second light L2 having the first wavelength.

The measuring unit 150 also obtains second positional characteristic information PI2 at the first position P1 of the first semiconductor chip, using the second light L2 having a second wavelength different from the first wavelength (S112). For example, the measuring unit 150 may obtain the second wavelength characteristic information 22 of the first semiconductor chip, using the second light L2 having the second wavelength, e.g., by detecting the third light L3 which is a reflected light of the second light L2 from the wafer W (e.g., from the first semiconductor chip). The second wavelength characteristic information 22 may include characteristic information such as the physical properties of the constituent, the shape of the pattern, and the thickness of the constituent of the semiconductor chip measured using the second light L2 having the second wavelength. The obtained second wavelength characteristic information 22 may include second positional characteristic information PI2 at the first position P1. For example, the second positional characteristic information PI2 may include characteristic information such as the physical properties of the constituent, the shape of the pattern, and the thickness of the constituent at the first position P1 of the first semiconductor chip measured using the second light L2 having the second wavelength.

Also, the measuring unit 150 obtains n-th positional characteristic information PIn at the first position P1 of the first semiconductor chip, using the second light L2 having a n-th wavelength different from each of the first and second wavelengths (S113). Here, n is a natural number equal to or greater than 3. For example, the measuring unit 150 may obtain n-th wavelength characteristic information 2*n* of the first semiconductor chip, using the second light L2 having the n-th wavelength. The n-th wavelength characteristic information 2*n* may include characteristic information such as physical properties, the shape of pattern, and thickness of the constituent of the semiconductor chip measured using the second light L2 having the n-th wavelength. The obtained n-th wavelength characteristic information 2*n* may include n-th positional characteristic information PIn at the first position P1. For example, the n-th positional characteristic information PIn may include characteristic information such as the physical properties of the constituent, the shape of the pattern, and the thickness of the constituent at the first position P1 of the first semiconductor chip measured using the second light L2 having the n-th wavelength.

The measuring unit 150 may inspect a 3D structure of the first semiconductor chip, using the obtained first to n-th positional characteristic information PI1, PI2, . . . , PIn. For example, the first to n-th positional characteristic information PI1, PI2, . . . , PIn may be obtained sequentially. However, the present disclosure is not limited thereto. In some other embodiments, the first to n-th positional characteristic information PI1, PI2, . . . , PIn may be obtained simultaneously.

Subsequently, the measuring unit 150 may combine the first to n-th positional characteristic information PI1, PI2, . . . , PIn to obtain the first spectral information SI1 at the position P1 of the first semiconductor chip (S114). For example, the first spectral information SI1 may include the first to n-th positional characteristic information PI1, PI2, . . . , PIn at the first position P1 of the first semiconductor chip measured using the second light L2 having different wavelengths from each other.

Referring to FIGS. 1, 3, 7, and 9 to 13, the measuring unit 150 may perform steps S111 to S114 described above to obtain first spectral information SI1 at the first position P1 of the first semiconductor chip (S110). Also, the measuring unit 150 may perform the above-described steps S111 to S114 on the second semiconductor chip to obtain the second spectral information SI2 at the first position P1 of the second semiconductor chip (S120). Also, the measuring unit 150 may perform the above-described steps S111 to S114 on a j-th semiconductor chip to obtain m-th spectral information at the first position P1 of the j-th semiconductor chip (S130). Here, each of j and m is a natural number equal to or greater than 3. For example, j and m may be the same number or may be different numbers from each other.

For example, the first to m-th spectral information may be obtained sequentially. However, the present disclosure is not limited thereto. In some other embodiments, the first to m-th spectral information may be obtained simultaneously.

Next, the measuring unit 150 may obtain a first plurality of pieces of spectral information by combining the first to m-th spectral information (S140). For example, the first plurality of pieces of spectral information may include first spectral information SI1 at the first position P1 of the first semiconductor chip, second spectral information SI2 at the first position P1 of the second semiconductor chip, third spectral information SI3 at the first position P1 of the third semiconductor chip, fourth spectral information SI4 at the first position P1 of the fourth semiconductor chip, and fifth spectral information SI5 at the first position P1 of the fifth semiconductor chip.

Referring to FIGS. 1, 3, 6, and 9 to 13, the measuring unit 150 may perform steps S110 to S140 described above to obtain the first plurality of pieces of spectral information at the first positions P1 of the plurality of semiconductor chips 10 (S11). For example, the measuring unit 150 may perform steps S110 to S140 described above to obtain the first to fifth spectral information SI1 to SI5 at the first positions P1 of the respective first to fifth semiconductor chips.

Subsequently, the measuring unit 150 may select some of the first plurality of pieces of spectral information to obtain first spectral distribution information SDI (S12). As shown in FIGS. 11 and 13, in a graph defined by X-coordinates and Y-coordinates (e.g., defined by X-axis and Y-axis), the first spectral distribution information SDI may include information on which the first plurality of pieces of spectral information are distributed. For example, in the graph defined by the X-coordinates and the Y-coordinates, the first spectral distribution information SDI may include information on which the first to fifth spectral information SI1 to SI5 are distributed.

The first spectral distribution information SDI may be obtained in the following process. For example, in FIG. 11, the measuring unit 150 may calculate a first distribution center C1 that is the distribution center of the pieces of spectral information included in the first plurality of pieces of spectral information. For example, in the graph of FIG. 11 defined by the X-coordinates and the Y-coordinates, the first distribution center C1 may be defined by calculating the center coordinates (e.g., X and Y coordinates) using respective coordinates of the spectral information included in the first plurality of pieces of spectral information. Next, in the graph of FIG. 11 defined by the X-coordinates and the Y-coordinates, the measuring unit 150 may obtain the first spectral distribution information SDI, using the extent (e.g., distances in the coordinate system) to which each piece of spectral information included in the first plurality of pieces of spectral information is separated from the first distribution center C1. The measuring unit 150 may obtain the first spectral distribution information SDI through such a process.

Subsequently, the measuring unit 150 may calculate the first statistical distribution region DR1 from the first spectral distribution information SDI (S13). For example, the measuring unit 150 may calculate the density of the pieces of spectral information included in the first spectral distribution information SDI to calculate the first statistical distribution region DR1. For example, it is possible to calculate the density of the pieces of spectral information included in the first spectral distribution information SDI, by calculating a region in which the distance between adjacent spectral information is formed to be equal to or less than a certain/predetermined distance.

For example, the first spectral distribution information SDI and the first statistical distribution region DR1 may be obtained in another process as follows. In FIG. 13, the measuring unit 150 may calculate a second distribution center C2, which is the distribution center of the pieces of spectral information included in the first plurality of pieces of spectral information. For example, in the graph of FIG. 13 defined by the X-coordinates and Y-coordinates, the second distribution center C2 may be defined by calculating the center coordinates using coordinates of each of the spectral information included in the first plurality of pieces of spectral information. Next, in the graph of FIG. 13 defined by the X-coordinates and the Y-coordinates, the measuring unit 150 may obtain the first spectral distribution information SDI, using the extent (e.g., distances in the coordinate system) to which each of the pieces of spectral information included in the first plurality of pieces of spectral information is separated from the second distribution center C2.

Subsequently, the measuring unit 150 may calculate the second statistical distribution region DR2 from the first spectral distribution information SDI. For example, the measuring unit 150 may calculate a second statistical distribution region DR2, by calculating the density of the pieces of spectral information included in the first spectral distribution information SDI. Next, the first statistical distribution region DR1 may be calculated, by calculating a region in which the density of the pieces of spectral information included in the first spectral distribution information SDI is high in the second statistical distribution region DR2.

The first statistical distribution region DR1 may be calculated by either of the two methods described above.

Subsequently, the measuring unit 150 may obtain spectral information that is not included in the first statistical distribution region DR1 among the entire first plurality of pieces of spectral information (S14). For example, in FIGS. 10 and 11, the first spectral information SI1 and the second spectral information SI2 are included in the first statistical distribution region DR1, and the third spectral information SI3 is not included in the first statistical distribution region DR1. For example, the measuring unit 150 may obtain third spectral information SI3 that is not included in the first statistical distribution region DR1.

Also, for example, in FIGS. 12 and 13, the first spectral information SI1 and the second spectral information SI2 are included in the first statistical distribution region DR1, and the fourth spectral information SI4 and the fifth spectral information SI5 are not included in the first statistical distribution region DR1. For example, the measuring unit 150 may obtain fourth spectral information SI4 and fifth spectral information SI5 that are not included in the first statistical distribution region DR1.

Subsequently, the measuring unit 150 may determine the semiconductor chips having spectral information not included in the first statistical distribution region DR1 as a defect (S15). For example, in FIGS. 10 and 11, the measuring unit 150 may determine the semiconductor chip having the third spectral information SI3 not included in the first statistical distribution region DR1 as a defect. For example, even if a distance d1 by which the third spectral information SI3 is separated from the first distribution center C1 is identical to a distance d2 by which the first spectral information SI1 is separated from the first distribution center C1, the semiconductor chip having the first spectral information SI1 included in the first statistical distribution region DR1 may be determined to be normal, and the semiconductor chip having the third spectral information SI3 not included in the first statistical distribution region DR1 may be determined to be defective.

Also, for example, in FIGS. 12 and 13, the semiconductor chips having the fourth spectral information SI4 and the fifth spectral information SI5 that are not included in the first statistical distribution region DR1 may be determined to be defective. For example, even if a distance d3 by which the first spectral information SI1 is separated from the second distribution center C2 is identical to a distance d4 by which the fourth spectral information SI4 is separated from the second distribution center C2, the semiconductor chip having the first spectral information SI1 included in the first statistical distribution region DR1 may be determined to be normal, and the semiconductor chip having the fourth spectral information SI4 not included in the first statistical distribution region DR1 may be determined to be defective.

Referring to FIGS. 1, 3, 5 and 9, the measuring unit 150 may perform steps S11 to S15 described above to inspect the patterns 15 at the same first positions P1 of the respective semiconductor chips 10 (S10). For example, each of the first positions P1 may be defined as the same position on the respective semiconductor chips 10. For example, the patterns 15 of the respective semiconductor chips 10 formed at the respective first positions P1 may have the same shape. For example, the first positions P1 of the respective semiconductor chips 10 may be positions at identical distances from respective reference points of the semiconductor chips 10 (e.g., corresponding corners of respective semiconductor chips in a plan view). For example, each of the first positions P1 of the semiconductor chips 10 may be at a position having first to fourth distances from four sides of the corresponding semiconductor chip 10 in a plan view, and the first to fourth distances are identical to the first to fourth distances of the first positions P1 of the other semiconductor chips 10. For example, when a first semiconductor chip 10 is aligned to fully vertically overlap a second semiconductor chip 10 after the semiconductor chips 10 are singularized, the first position P1 of the first semiconductor chip 10 will fully vertically overlap the first position P1 of the second semiconductor chip 10. The same position on the respective semiconductor chips 10 described above is interpreted in this way.

The measuring unit 150 may inspect second patterns 15 at the same second positions P2 of the respective semiconductor chips 10 (S20). For example, the second positions P2 may be defined as the same position on the respective semiconductor chips 10. For example, the patterns 15 of the respective semiconductor chips 10 formed at the respective second positions P2 may have the same shape. For example, the second patterns 15 of the second positions may have different shapes from or the same shape as the patterns 15 of the first positions.

Also, the measuring unit 150 may inspect k-th patterns 15 at the same positions on the respective semiconductor chips 10. For example, the k-th patterns 15 at the same k-th positions of the respective semiconductor chips 10 may be inspected (S30). For example, the k-th positions may be defined as the same position in the respective semiconductor chips 10. For example, the k-th patterns 15 of the respective semiconductor chips 10 formed at respective k-th positions may have the same shape. For example, the k-th patterns 15 of the k-th positions may have different shapes from or the same shape as the patterns 15 of the first positions and/or the second patterns of the second positions. Here, k is a natural number equal to or greater than 3. For example, the measuring unit 150 may inspect the patterns 15 of the respective semiconductor chips 10 at the respective first to k-th positions. The patterns 15 of the first positions of the semiconductor chips 10 and the second to k-th patterns of the second to k-th positions of the chips 10 may be collectively or separately referred to as patterns 15 in the present disclose, and should be interpreted according to the context in which they are discussed. The second positions P2 and the k-th positions of the respective semiconductor chips 10 will be understood in the same way as described above with respect to the first positions P1 between the semiconductor chips 10.

For example, the patterns 15 of the plurality of semiconductor chips 10 may be inspected sequentially at the respective first to k-th positions. However, the present disclosure is not limited thereto. In some other embodiments, the inspection of pattern 15 of the plurality of semiconductor chips 10 at the respective first to k-th positions may be performed simultaneously.

Subsequently, the measuring unit 150 may determine the semiconductor chip having a defective pattern by combining the pattern inspection results at the respective first to k-th positions (S40). The wafer W may be inspected through such a wafer inspection method. A method for inspecting the wafer W through steps S10 to S40 described above may correspond to the second step S2 of FIG. 4.

Each of the wafer inspection apparatus, the wafer inspection method, and the method for fabricating the semiconductor device using the wafer inspection apparatus according to some embodiments of the present disclosure may obtain the pieces of statistical information such as spectral information, spectral distribution information and statistical distribution region, using light having different wavelengths from each other, thereby improving the reliability of inspection on the wafer including the plurality of semiconductor chips including patterns having non-repetitive structures.

Hereinafter, a wafer inspection method according to some other embodiments of the present disclosure will be described with reference to FIG. 14. Differences from the wafer inspection method shown in and described with respect to FIGS. 5 to 8 will be mainly described.

Figure 14:
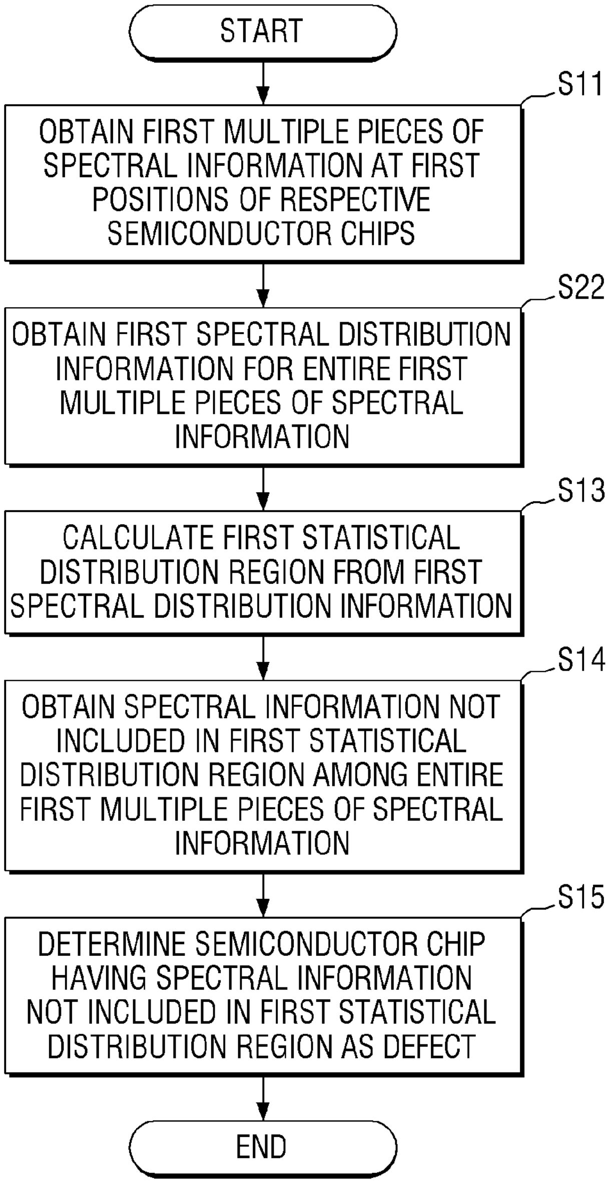
FIG. 14 is a flow chart for explaining a wafer inspection method according to some other embodiments of the disclosure.

FIG. 14 is a flow chart for explaining a wafer inspection method according to some other embodiments of the present disclosure.

Referring to FIG. 14, the measuring unit (150 of FIG. 1) may obtain a first plurality of pieces of spectral information at the first positions (P1 of FIG. 9) of the plurality of semiconductor chips (10 of FIG. 3) (S11). Subsequently, the measuring unit (150 of FIG. 1) may obtain the first spectral distribution information (SDI of FIG. 11) for the entire first plurality of pieces of spectral information (S22). Subsequently, the measuring unit (150 of FIG. 1) may calculate the first statistical distribution region (DR1 of FIGS. 11 and 13) from the first spectral distribution information (SDI of FIG. 11) (S13). Subsequently, the measuring unit (150 of FIG. 1) may obtain (e.g., determine) spectral information that is not included in the first statistical distribution region (DR1 of FIGS. 11 and 13) among the entire first plurality of pieces of spectral information (S14). Subsequently, the measuring unit (150 of FIG. 1) may determine the semiconductor chips having spectral information not included in the first statistical distribution region (DR1 of FIGS. 11 and 13) to be defective (S15).

A method for fabricating the semiconductor device using the wafer inspection apparatus according to some other embodiments of the present disclosure will be described below with reference to FIGS. 1 to 3, 15 and 17. Differences from the method for fabricating the semiconductor device shown in and described with respect to FIGS. 4 to 8 will be mainly described.

Figure 15:
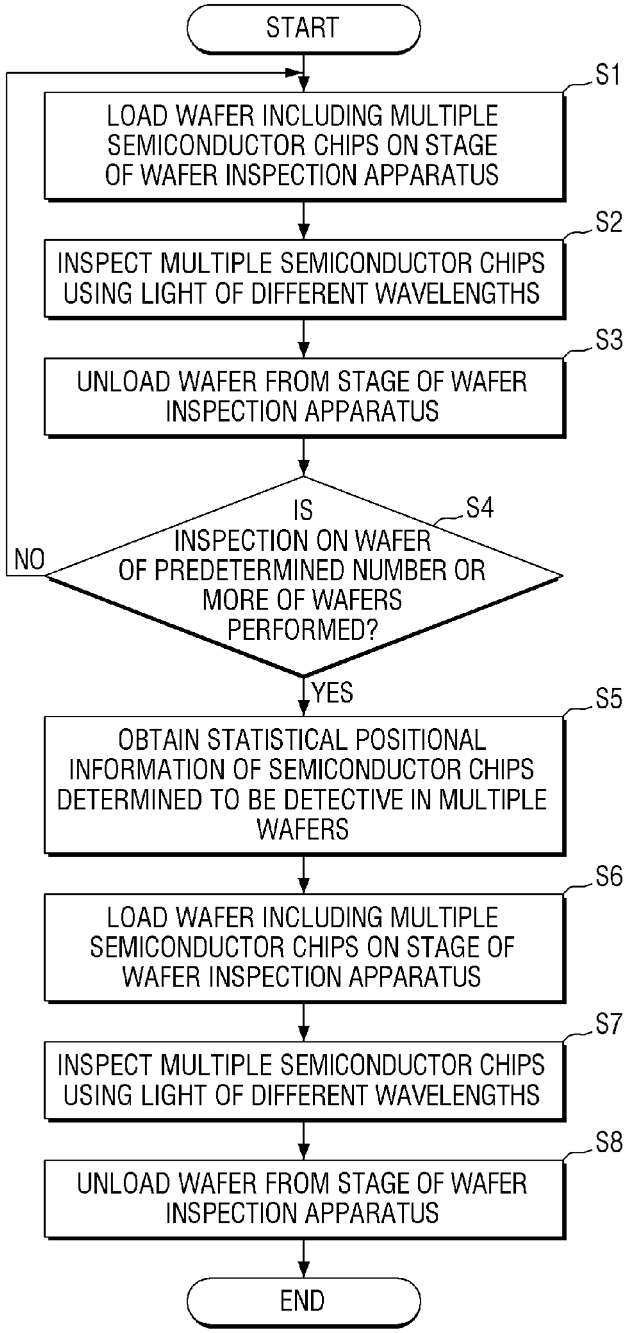
FIGS. 15 and 16 are flow charts for explaining a method for fabricating the semiconductor device using the wafer inspection apparatus according to some other embodiments of the present disclosure.
Figure 16:
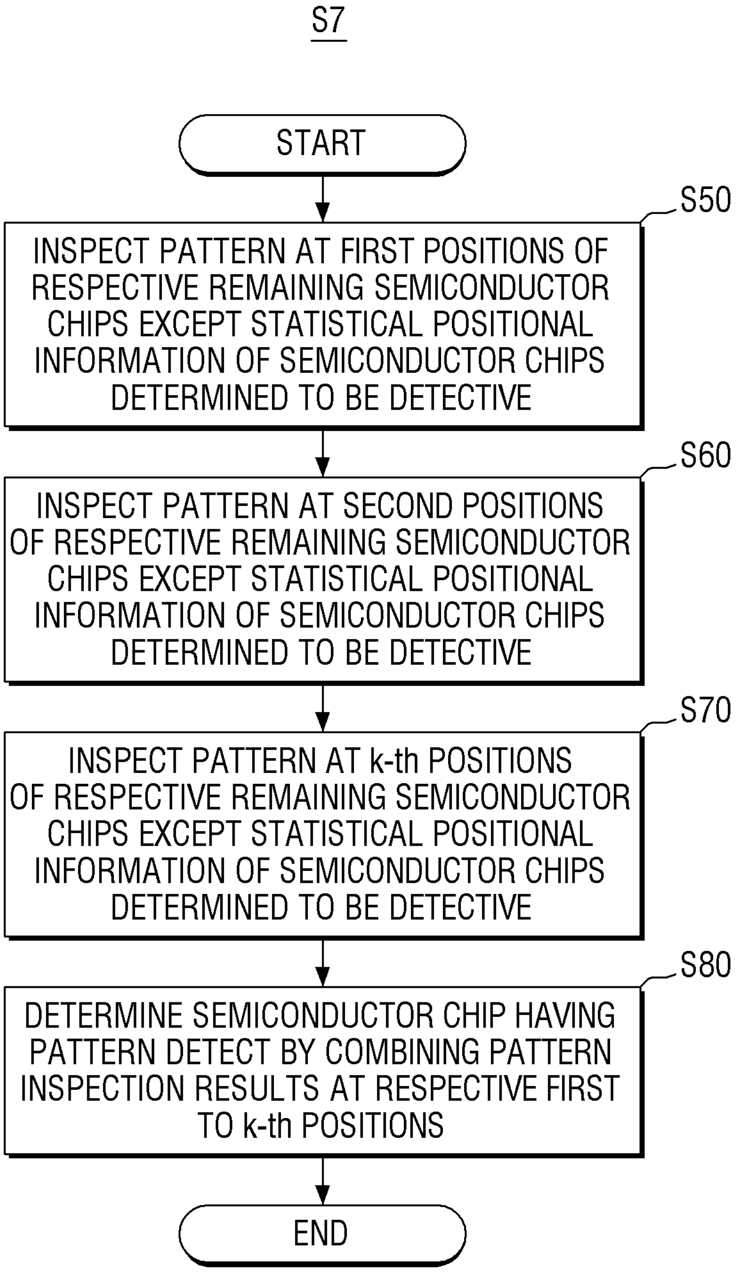
Figure 17:
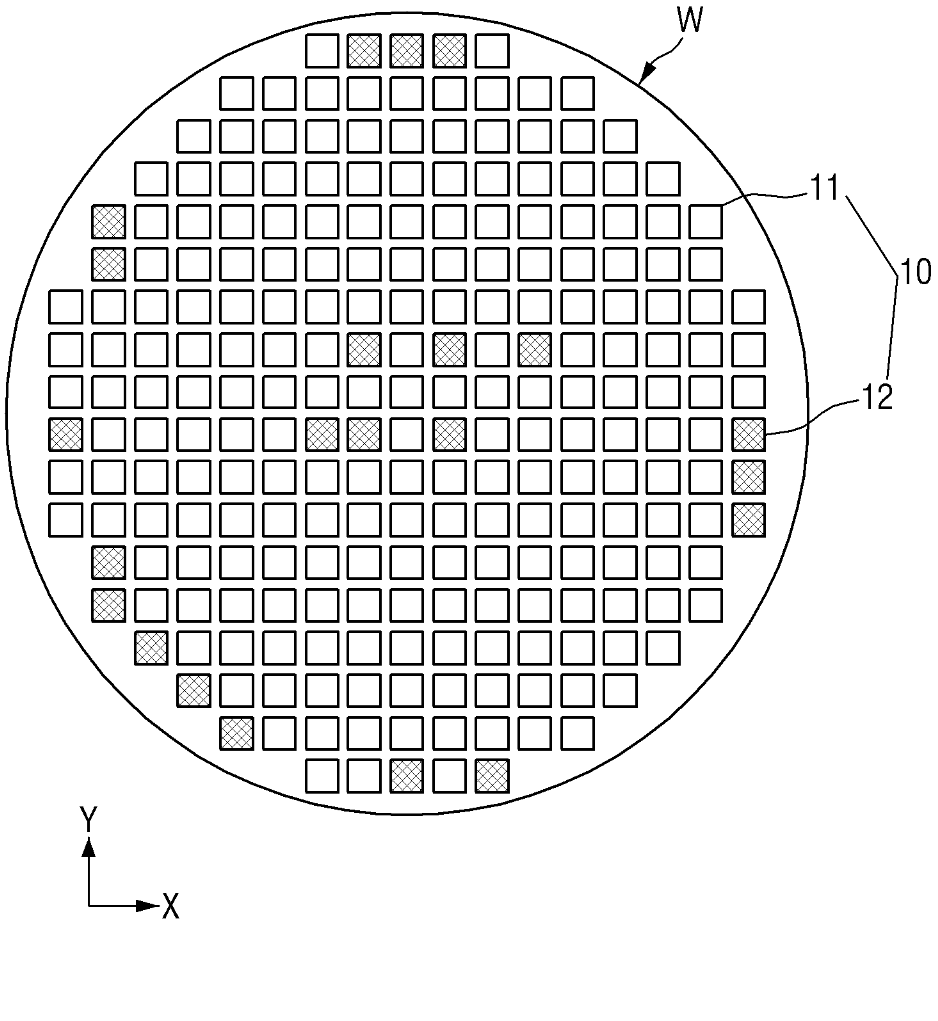
FIG. 17 is a plan view for explaining a layout of a wafer used in the method for fabricating the semiconductor device shown in FIGS. 15 and 16.

FIGS. 15 and 16 are flow charts for explaining the method for fabricating the semiconductor device using the wafer inspection apparatus according to some other embodiments of the present disclosure. FIG. 17 is a plan view for explaining a layout of a wafer used in the method for fabricating the semiconductor device shown in FIGS. 15 and 16.

Referring to FIGS. 1 to 3 and 15 to 17, a first step S1 in which a first wafer W including a plurality of semiconductor chips 10 is loaded onto a stage 100 of a wafer inspection apparatus, a second step S2 of inspecting the first wafer W using the wafer inspection apparatus, and a third step S3 of unloading the first wafer W, which has been inspected, from the stage 100 of the wafer inspection apparatus may be sequentially performed.

Subsequently, the measuring unit 150 may determine whether a predetermined number or more of wafers are inspected (S4). For example, when the number of wafers less than a predetermined number are inspected, the first to third steps S1 to S3 may be repeatedly performed to inspect other wafers.

For example, when a predetermined number or more of wafers are inspected, the measuring unit 150 may obtain statistical position information of the semiconductor chips (12 of FIG. 17) determined to be defective in a plurality of wafers (S5). In addition, the measuring unit 150 may obtain the statistical position information of the semiconductor chips (11 of FIG. 17) determined to be normal on the plurality of wafers. Subsequently, a second wafer including a plurality of semiconductor chips may be loaded onto the stage 100 of the wafer inspection apparatus (S6).

Subsequently, the measuring unit 150 may inspect the second wafer, using the wafer inspection apparatus (S7). Referring to FIG. 16, the step S7 of inspecting the second wafer using the wafer inspection apparatus may include steps S50 to S80. For example, the measuring unit 150 may inspect the patterns 15 at the first positions P1 of the remaining semiconductor chips (11 of FIG. 17) that are determined to be normal, except for the statistical position information of the semiconductor chips (12 of FIG. 17) that are determined to be defective (S50). For example, the remaining semiconductor chips may be semiconductor chips considered to be placed in non-defective and/or normal positions of the wafers by previously obtained information.

The measuring unit 150 may inspect the patterns 15 at the second positions P2 of the remaining semiconductor chips (11 of FIG. 17) that are determined to be normal, except for the statistical position information of the semiconductor chips (12 of FIG. 17) that are determined to be defective (S60). The measuring unit 150 may inspect the patterns 15 at the k-th positions of the remaining semiconductor chips (11 of FIG. 17) that are determined to be normal, except for the statistical position information of the semiconductor chips (12 of FIG. 17) that are determined to be defective (S70). Here, k is a natural number equal to or greater than 3. For example, the measuring unit 150 may inspect the patterns 15 of the remaining semiconductor chips (11 of FIG. 17) determined to be normal at the respective first to k-th positions.

For example, the patterns 15 of the remaining semiconductor chips (11 of FIG. 17) determined to be normal at the respective first to k-th positions may be inspected sequentially. However, the present disclosure is not limited thereto. In some other embodiments, the patterns 15 of the remaining semiconductor chips (11 of FIG. 17) determined to be normal at the respective first to k-th positions may be inspected simultaneously. Subsequently, the measuring unit 150 may determine a semiconductor chip having a defective pattern, by combining the pattern inspection results at the respective first to k-th positions (S80).

Referring to FIG. 15 again, after determining the semiconductor chips having defective patterns by performing steps S50 to S80, the second wafer that is completed with the inspection may be unloaded from the stage 100 of the wafer inspection apparatus.

Even though different figures illustrate variations of exemplary embodiments and different embodiments disclose different features from each other, these figures and embodiments are not necessarily intended to be mutually exclusive from each other. Rather, features depicted in different figures and/or described above in different embodiments can be combined with other features from other figures/embodiments to result in additional variations of embodiments, when taking the figures and related descriptions of embodiments as a whole into consideration. For example, components and/or features of different embodiments described above can be combined with components and/or features of other embodiments interchangeably or additionally to form additional embodiments unless the context clearly indicates otherwise, and the present disclosure includes the additional embodiments.

Although the embodiments according to the present disclosure have been described above with reference to the accompanying drawings, the present disclosure is not limited to the above embodiments, and may be modified in various forms. Those skilled in the art will appreciate that the present disclosure may be embodied in other specific forms without changing the technical spirit or essential features of the present disclosure. Accordingly, the above-described embodiments should be understood in all respects as illustrative and not restrictive.

What is claimed is:

1. A method for fabricating a semiconductor device, the method comprising:

a first step of loading a first wafer including a plurality of semiconductor chips, each having an identical pattern, on a stage of a wafer inspection apparatus;

a second step of inspecting the plurality of semiconductor chips using multiple wavelengths of light; and a third step of unloading the first wafer from the stage of the wafer inspection apparatus, wherein inspecting the plurality of semiconductor chips using the light includes:

inspecting patterns at identical first positions of each of the respective semiconductor chips, inspecting patterns at identical second positions of each of the respective semiconductor chips, inspecting patterns at identical k-th positions of each of the respective semiconductor chips, and determining a semiconductor chip of the plurality of semiconductor chips having a pattern defect by combining pattern inspection results for each of the first to k-th positions, k being a natural number of 3 or more, and wherein inspecting the patterns at the identical first positions includes:

obtaining a first plurality of pieces of spectral information at the first positions using the multiple wavelengths of light, obtaining a first spectral distribution information from the first plurality of pieces of spectral information, calculating a statistical distribution region from the first spectral distribution information, identifying outlier pieces of spectral information not included in the statistical distribution region among the first plurality of pieces of spectral information, and determining the semiconductor chip having a pattern defect by associating the outlier pieces of spectral information not included in the statistical distribution region as a defect.

2. The method for fabricating the semiconductor device of claim 1, wherein obtaining the first plurality of pieces of spectral information at the identical first positions using the multiple wavelengths of light comprises:

obtaining first spectral information at the first position of a first semiconductor chip, obtaining m-th spectral information at the first position of a j-th semiconductor chip, and obtaining the first plurality of pieces of spectral information by combining the first to m-th spectral information, and wherein each of j and m is a natural number of 3 or more.

3. The method for fabricating the semiconductor device of claim 2, wherein obtaining the first spectral information at the first position of the first semiconductor chip comprises:

obtaining first positional characteristic information at the first position of the first semiconductor chip using a first wavelength of light, obtaining second positional characteristic information at the first position of the first semiconductor chip using a second wavelength of light different than the first wavelength of light, obtaining n-th positional characteristic information at the first position of the first semiconductor chip using a n-th wavelength of light different from the first wavelength of light and the second wavelength of light, and obtaining the first spectral information at the first position of the first semiconductor chip by combining the first to n-th positional characteristic information, and wherein n is a natural number of 3 or more.

4. The method for fabricating the semiconductor device of claim 1, wherein obtaining the first spectral distribution information from the first plurality of pieces of spectral information comprises:

calculating a first distribution center that is a distribution center of the pieces of spectral information included in the first plurality of pieces of spectral information, and obtaining the first spectral distribution information using an extent to which each of the first plurality of pieces of spectral information is separated from the first distribution center.

5. The method for fabricating the semiconductor device of claim 1, wherein calculating the statistical distribution region from the first spectral distribution information comprises calculating a density of pieces of spectral information included in the first spectral distribution information.

6. The method for fabricating the semiconductor device of claim 1, wherein each of the plurality of semiconductor chips comprises patterns disposed in a non-repetitive manner.

7. The method for fabricating the semiconductor device of claim 1, further comprising:

repeatedly performing the first to third steps on wafers different from the first wafer until a predetermined number of wafers are inspected;

obtaining statistical position information for the semiconductor chips determined to be defective on a plurality of wafers, after the inspection of the predetermined number of wafers is completed; and inspecting a second wafer different from the first wafer using the statistical position information of the semiconductor chips determined to be defective.

8. The method for fabricating the semiconductor device of claim 7, wherein inspecting the second wafer comprises:

inspecting patterns at the identical first positions of the semiconductor chips, except for the statistical position information of the semiconductor chips determined to be defective, inspecting patterns at identical k-th positions of the semiconductor chips, except for the statistical position information of the semiconductor chips determined to be defective, and determining a semiconductor chip having a pattern defect, by combining pattern inspection results of the semiconductor chips at each of the first to k-th positions.

9. The method for fabricating the semiconductor device of claim 1, wherein obtaining the first spectral distribution information using the first plurality of pieces of spectral information comprises:

selecting some of the first plurality of pieces of spectral information to obtain the first spectral distribution information.

10. The method for fabricating the semiconductor device of claim 1, wherein obtaining the first spectral distribution information using the first plurality of pieces of spectral information comprises:

obtaining the first spectral distribution information for all of the first plurality of pieces of spectral information.

11. A method for fabricating a semiconductor device, the method comprising:

loading a wafer including a plurality of semiconductor chips having identical patterns on a stage of a wafer inspection apparatus;

providing a first light having a plurality of wavelengths to a spectroscope;

splitting the first light into a plurality of second wavelengths of second light using the spectroscope, each of the plurality of second wavelengths being a different wavelength among the plurality of wavelengths;

providing the plurality of second wavelengths of second light to the wafer; and inspecting the plurality of semiconductor chips using the plurality of second wavelengths of second light, wherein inspecting the plurality of semiconductor chips using the plurality of wavelengths of second light includes:

inspecting patterns at identical first positions of each of the respective semiconductor chips, inspecting patterns at identical second positions of each of the respective semiconductor chips, inspecting patterns at identical k-th positions of each of the respective semiconductor chips, and determining a semiconductor chip of the plurality of semiconductor chips having a pattern defect by combining pattern inspection results for each of the first to k-th positions, k being a natural number of 3 or more, and wherein inspecting the patterns at the identical first positions includes:

obtaining a first plurality of pieces of spectral information at the first positions using the plurality of wavelengths of second light, obtaining a first spectral distribution information using the first plurality of pieces of spectral information, calculating a statistical distribution region from the first spectral distribution information, obtaining spectral information not included in the statistical distribution region among the first plurality of pieces of spectral information, and determining a semiconductor chip having a pattern defect by associating the spectral information not included in the statistical distribution region as a defect.

12. The method for fabricating the semiconductor device of claim 11, wherein obtaining of the first plurality of pieces of spectral information at the first positions using the plurality of second wavelengths of second light comprises:

obtaining a first spectral information at the first position of a first semiconductor chip, obtaining m-th spectral information at the first position of a j-th semiconductor chip, and obtaining the first plurality of pieces of spectral information by combining the first to m-th spectral information, and wherein each of j and m is a natural number of 3 or more.

13. The method for fabricating the semiconductor device of claim 12, wherein obtaining of the first spectral information at the first position of the first semiconductor chip comprises:

obtaining a first positional characteristic information at the first position of the first semiconductor chip using a first wavelength of the second, obtaining a n-th positional characteristic information at the first position of the first semiconductor chip using a n-th wavelength of the second light different from the first wavelength, and obtaining the first spectral information at the first position of the first semiconductor chip by combining the first to n-th positional characteristic information, and wherein n is a natural number of 3 or more.

14. The method for fabricating the semiconductor device of claim 11, wherein obtaining of the first spectral distribution information from the first plurality of pieces of spectral information comprises:

calculating a first distribution center that is a distribution center of the pieces of spectral information included in the first plurality of pieces of spectral information, and obtaining the first spectral distribution information using an extent to which each of the first plurality of pieces of spectral information is separated from the first distribution center.

15. The method for fabricating the semiconductor device of claim 11, wherein calculating the statistical distribution region from the first spectral distribution information comprises calculating a density of pieces of spectral information included in the first spectral distribution information.

16. The method for fabricating the semiconductor device of claim 15, wherein calculating the first statistical distribution region comprises:

calculating the density of pieces of spectral information included in the first spectral distribution information to calculate a second statistical distribution region, and calculating a region in which the density of pieces of spectral information is high in the second statistical distribution region to calculate the first statistical distribution region.

17. The method for fabricating the semiconductor device of claim 11, wherein each of the plurality of semiconductor chips includes patterns disposed in a non-repetitive manner.

18. The method for fabricating the semiconductor device of claim 11, wherein obtaining the first spectral distribution information using the first plurality of pieces of spectral information comprises selecting some of the first plurality of pieces of spectral information to obtain the first spectral distribution information.

19. The method for fabricating the semiconductor device of claim 11, wherein obtaining of the first spectral distribution information using the first plurality of pieces of spectral information comprises obtaining the first spectral distribution information for all of the first plurality of pieces of spectral information.

20. A method for fabricating a semiconductor device, the method comprising:

loading a wafer including a plurality of semiconductor chips, each having an identical pattern, on a stage of a wafer inspection apparatus;

inspecting patterns at identical first positions of respective semiconductor chips using multiple wavelengths of light;

inspecting patterns at identical second positions of the respective semiconductor chips using the multiple wavelengths of light;

inspecting patterns at identical k-th positions of the respective semiconductor chips using the multiple wavelengths of light; and determining a semiconductor chip of the plurality of semiconductor chips having a pattern defect by combining pattern inspection results for each of the respective first to k-th positions, k being a natural number of 3 or more, wherein inspecting the pattern at the identical first positions includes:

obtaining a first plurality of pieces of spectral information at the first positions using the multiple wavelengths of light, obtaining a first spectral distribution information from the first plurality of pieces of spectral information, calculating a statistical distribution region from the first spectral distribution information, identifying outlier pieces of spectral information not included in the statistical distribution region among the first plurality of pieces of spectral information, and determining the semiconductor chip having a pattern defect by associating having the outlier pieces of spectral information not included in the statistical distribution region as a defect, wherein obtaining the first plurality of pieces of spectral information at the first positions using the multiple wavelengths of light comprises:

obtaining a first spectral information at the first position of a first semiconductor chip, obtaining m-th spectral information at the first position of a j-th semiconductor chip, and obtaining the first plurality of pieces of spectral information by combining the first to m-th spectral information, each of j and m is a natural number of 3 or more, and wherein obtaining the first spectral distribution information using the first plurality of pieces of spectral information comprises:

calculating a first distribution center which is a distribution center of the pieces of spectral information included in the first plurality of pieces of spectral information, and obtaining the first spectral distribution information using an extent to which each of the first plurality of pieces of spectral information is separated from the first distribution center.

* * * * *